United States Patent
Yiu et al.

(10) Patent No.: US 7,123,537 B2
(45) Date of Patent: Oct. 17, 2006

(54) DECODER ARRANGEMENT OF A MEMORY CELL ARRAY

(75) Inventors: Tom D. Yiu, Milpitas, CA (US); Ful L. Ni, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 234 days.

(21) Appl. No.: 10/389,264

(22) Filed: Mar. 14, 2003

(65) Prior Publication Data

US 2003/0210583 A1 Nov. 13, 2003

Related U.S. Application Data

(60) Provisional application No. 60/364,563, filed on Mar. 15, 2002.

(51) Int. Cl.
*G11C 8/00* (2006.01)
(52) U.S. Cl. .............. 365/230.03; 365/230.06
(58) Field of Classification Search ........... 365/230.03, 365/230.06
See application file for complete search history.

(56) References Cited

U.S. PATENT DOCUMENTS

| | | | |
|---|---|---|---|
| 4,875,188 A | 10/1989 | Jungroth | |
| 5,050,125 A | 9/1991 | Momodomi et al. | |
| 5,065,364 A | 11/1991 | Atwood et al. | |
| 5,091,888 A | 2/1992 | Akaogi | |
| 5,095,461 A | 3/1992 | Miyakawa et al. | |
| 5,117,394 A | 5/1992 | Amin et al. | |
| 5,142,496 A | 8/1992 | Van Buskirk | |
| 5,319,605 A * | 6/1994 | Min et al. | 365/230.06 |
| 5,371,702 A | 12/1994 | Nakai et al. | |
| 5,414,664 A | 5/1995 | Lin et al. | |
| 5,428,569 A | 6/1995 | Kato et al. | |
| 5,596,530 A | 1/1997 | Lin et al. | |
| 5,798,968 A * | 8/1998 | Lee et al. | 365/185.29 |
| 5,910,927 A * | 6/1999 | Hamamoto et al. | 365/230.03 |
| 5,963,475 A * | 10/1999 | Choi et al. | 365/185.11 |
| 6,448,602 B1 * | 9/2002 | Sakashita et al. | 257/303 |
| 2002/0147885 A1 * | 10/2002 | Mobley | 711/106 |

FOREIGN PATENT DOCUMENTS

| | | |
|---|---|---|
| DE | 41 19 394 A1 | 6/1991 |
| EP | 0 392 895 | 10/1990 |
| EP | 0 559 213 | 9/1993 |
| EP | 0 700 570 B1 | 7/2001 |
| JP | 5-182479 | 12/1991 |

* cited by examiner

*Primary Examiner*—Thong Q. Le
(74) *Attorney, Agent, or Firm*—Ernest J. Beffel, Jr.; Haynes Beffel & Wolfeld LLP

(57) ABSTRACT

A hybrid memory cell array including a preferable arrangement of a row decoder is proposed, and in the same manner of addressing a memory cell in the memory array a high access speed of the memory cell and high integration layout of a memory chip can be achieved. A hybrid memory cell includes a plurality of memory cells that each includes an electronic circuit to store binary logic values, a plurality of word lines, a plurality of bit lines, a row decoder arranged in the memory cell array to enable the plurality of word lines and select a memory cell on a same word line, and a column decoder arranged outside the memory cell array to enable the plurality of bit lines and select a memory cell on a same bit line.

8 Claims, 2 Drawing Sheets

DECODER ARRANGEMENT OF A MEMORY CELL ARRAY

RELATED APPLICATIONS

This application claims priority to U.S. Provisional Application No. 60/364,563 filed Mar. 15, 2002 entitled DECODER ARRANGEMENT OF A MEMORY CELL ARRAY, which application is incorporated in its entirety as if fully set forth herein.

FIELD OF THE INVENTION

The present invention relates to a hybrid memory cell array, and more particularly to an arrangement of word line drivers for a hybrid memory array.

BACKGROUND OF THE INVENTION

Semiconductor memories have been widely used in various applications for storing data. As the applications become more demanding, the systems on which the applications run require higher memory densities. Thanks to the semiconductor industry, the integration of semiconductor devices has continuously improved. Increased memory densities have increased the capacity of a single memory device from several KB to over one GB. Access time to memory devices has also challenged engineers. From time to time, different approaches to improve the access time to a memory device have been developed by brilliant engineers. One approach to improved access time is reduced signal line delay, as signal lines often cross a large group of memory cells. This approach should include refining the arrangement of a memory array and its peripheral circuitry.

FIG. 1 is a simplified view of a typical memory chip. A memory chip 100 includes several memory cell arrays 102, data input lines 104 and data output lines 106, address lines 108 and signal control lines 110. The address lines 108 include word lines and bit lines (not shown) for addressing a memory cell in the memory cell array. The signal control lines 110 are employed to transmit control signals while data reading and writing, and address lines enabling.

FIG. 2 further illustrates one conventional decoder arrangement of one of the memory cell arrays in FIG. 1. The memory array in this embodiment includes 64M memory cells 210 arranged in an array of 8K rows by 8K columns. A row decoder 202 and column decoder 204 are respectively arranged peripheral to the memory cell array 200. Together, the row decoder 202 and column decoder 204 enable some word lines 206 and bit lines 208 for addressing one or more particular memory cells 210, and accessing the data stored in the memory cells 210. As the row decoder 202 enables the word lines 206 and the column decoder 204 enables the bit lines 208, there is always a delay in accessing memory cells on the same word line. The word line length thus limits the access speed of a memory cell.

FIG. 3 illustrates an improved arrangement of the array 200, shown in FIG. 2, and its peripheral. This embodiment includes three row decoders 302a, 302b and 302c that are disposed within the memory cell array 300 and one column decoder 304 that is arranged peripheral to the memory cell. The memory cell array 300, for example, also includes 64M memory cells 310 but is divided into 4 sub-arrays, 300a–300d, such that each sub-array has 16M memory cells. As a word line in this configuration runs across a sub-array having only 2k memory cells, its length is greatly shortened. Shorter word lines to access a memory cell within a sub-array should be faster. Furthermore, row decoders positioned within the memory array can enable either the right-side or the left-side word lines, thereby improving the data access selecting rate and improving the access speed. In this arrangement, memory cell access speed is about 16 times faster than in array 200 of FIG. 2.

However, the arrangement of three row decoders within the memory cell array layout increases the layout size. The memory cell count on a memory chip decreases, which decreases the integration.

Consequently, comparing the two different decoder arrangements described above, array 200 wins the benefit of high integration layout density but fails to provide high access speed. The array 200 arrangement is limited to ROM, RAM, EPROM (Erasable Programmable ROM), EEPROM or Flash Memory, for example. Array 300 wins the benefit of high access speed but fails the high integration layout density. The array 300 arrangement is used for a higher speed register, for example.

SUMMARY OF THE INVENTION

The present invention provides a hybrid memory array structure that has high integration for optimizing the density of memory cells, and still gains high access speed on accessing memory cells. The hybrid memory array of the invention includes at least two sub-arrays, a row decoder disposed between two sub-arrays, and a column decoder. Unlike array 300a–300d of FIG. 3, the sub-arrays of the present invention are not evenly divided, but in a ratio of about 2 or higher along the row direction. That is, the length of word lines running across one sub-array is not longer than one half of the length of word lines that run across the other sub-array. As a result, the sub-array with shorter word lines gains high access speed while the other sub-array retains its high density.

It is one object of the present invention to provide a hybrid memory array that has high access speed to some of the memory cells while remaining high density. A further object of the present invention is to provide a hybrid memory array that is suitable for a mass data storage device, and for a fast application as well. Another object of the present invention is to provide a solution for applications which require high access speed on the execution of program codes, and sufficient memory space for storing data within limited semiconductor real estate.

BRIEF DESCRIPTION OF THE DRAWINGS

These and other objects of the present invention can be better appreciated from the following detailed description of the invention, taken with reference to the appended figures, in which.

DETAILED DESCRIPTION OF THE INVENTION

Figure 1:
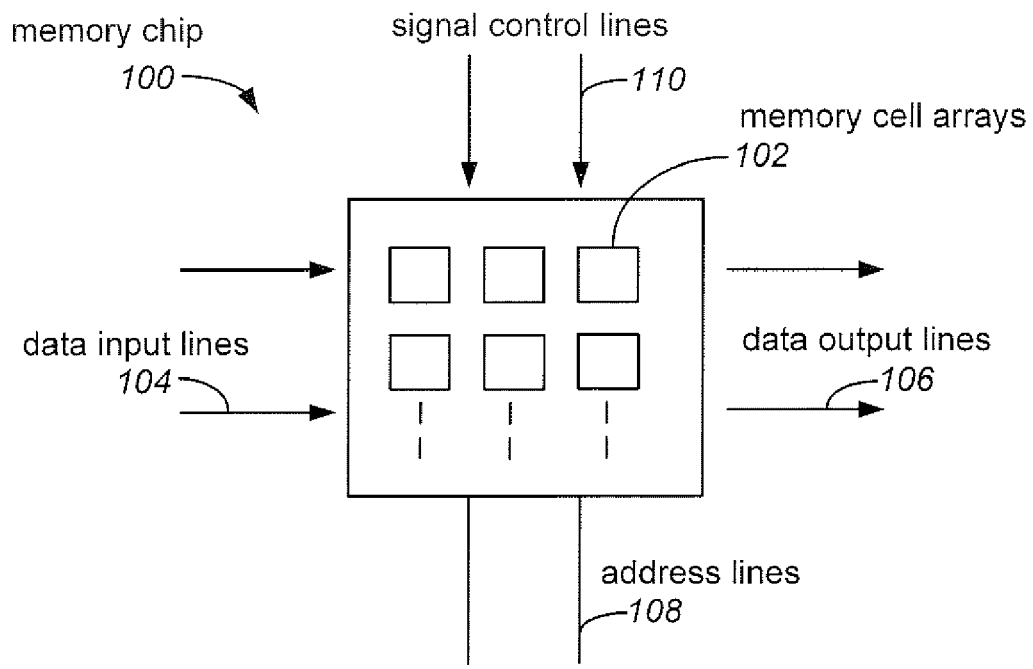
FIG. 1 is a schematic block diagram showing a conventional memory array device.
Figure 2:
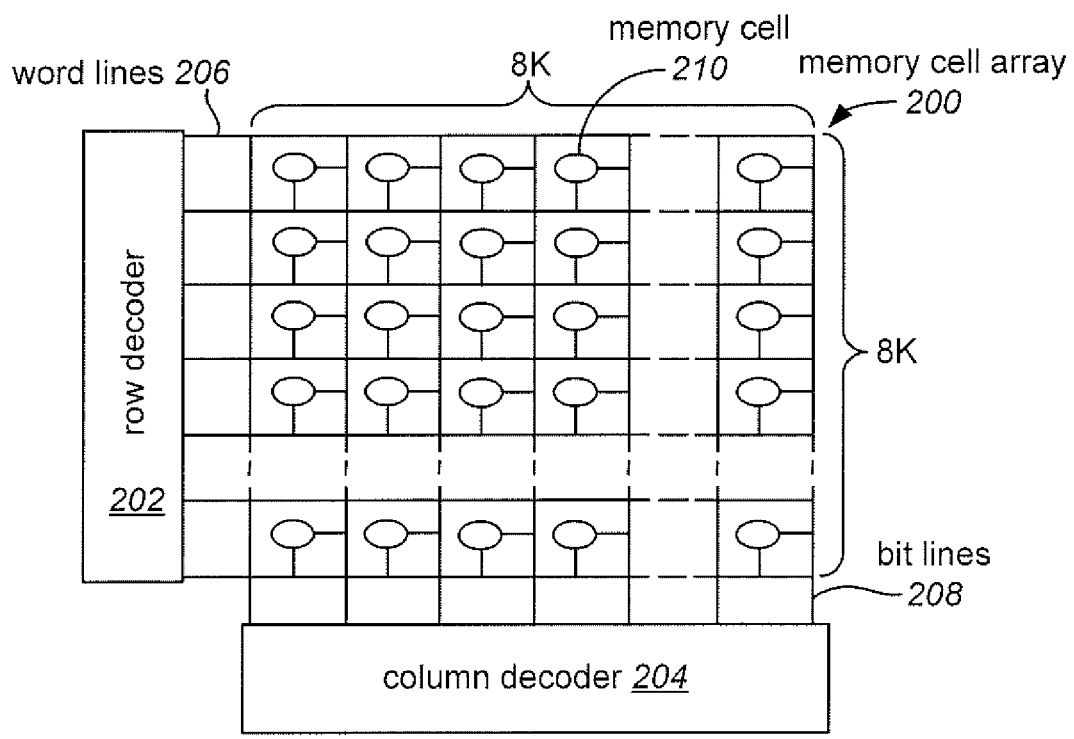
FIG. 2 is a schematic block diagram showing a conventional memory array.
Figure 3:
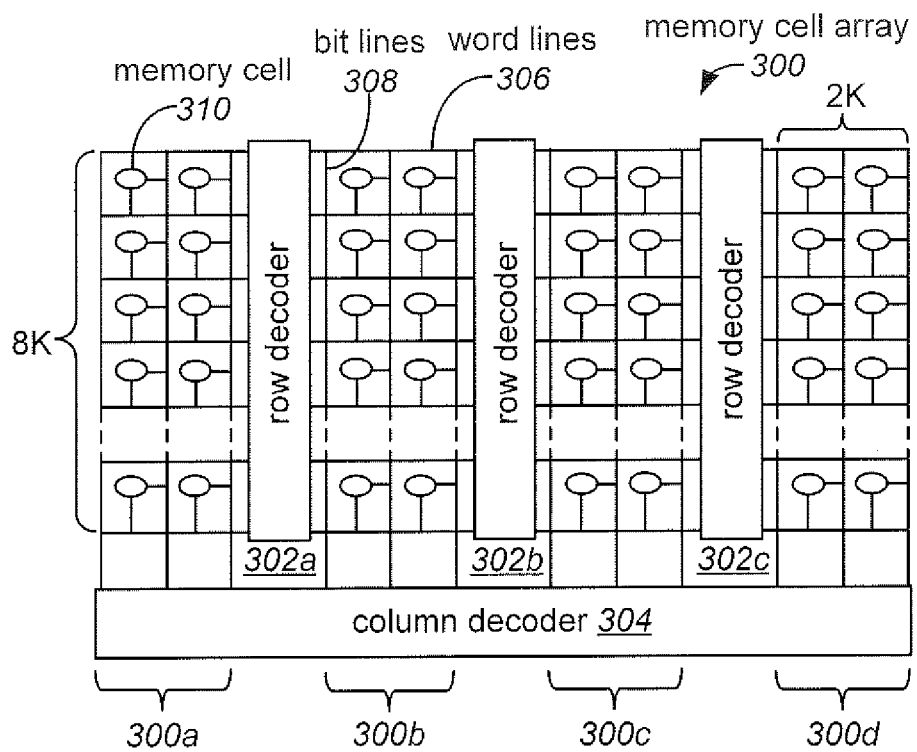
FIG. 3 is a schematic block diagram showing another conventional memory array.
Figure 4:
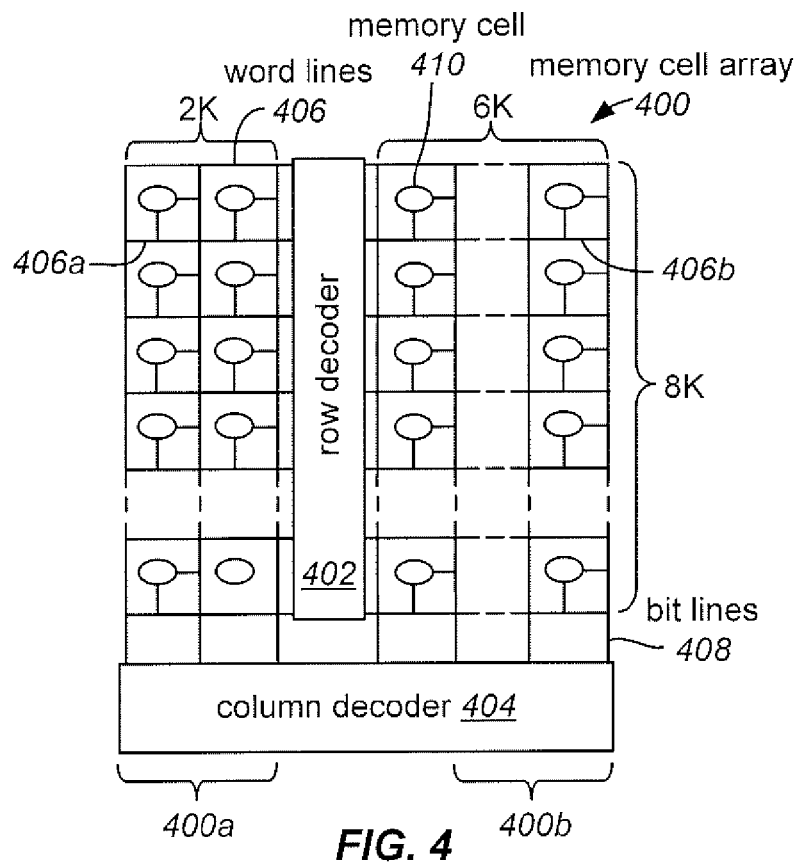
FIG. 4 is a schematic block diagram showing the hybrid memory array of a preferred embodiment of the invention.

FIG. 4 is a schematic diagram showing the decoder arrangement of a hybrid memory cell array according to the present invention. A memory array 400 includes at least two sub-arrays 400a and 400b, a row decoder 402 and a column decoder 404. Each sub-array of 400a and 400b is formed by a number of memory cells 410, wherein the access to each of the memory cells is controlled by word lines 406 and bit lines 408. Sub-arrays 400a and 400b are not the same size, sub-array 400a is about half of the size of sub-array 400b or less. The word line decoder circuit is disposed between two sub-arrays 400a and 400b, and selectively enables either the word lines to sub-array 400a or sub-array 400b. Since the sub-arrays 400a and 400b are different in size along the word line direction, the length of a word line running across sub-array 400a is much shorter than that of a word line that runs across sub-array 400b.

For example, as shown in FIG. 4, the row decoder 402 is placed in a memory cell array 400 including 64M memory cells. The word lines 406a across sub-array 400a on the left side are made shorter than the word lines 406b across sub-array 400b on the right side of the row decoder in length. Sub-array 400a may connect 2K columns of memory cells on the left while sub-array 400b on the right side connects 6K columns of memory cells on the same word line. In such a manner, the memory cell array 400 may be employed as a high integration memory such as the ROM, RAM, EPROM, EEPROM and Flash Memory described above by enabling the right side word lines, or it can be used as a high access speed memory such as the register by enabling the left side word lines. With the two benefits of high density and high access speed, the ratio of word lines that run across two sub-arrays should be higher than 1, and is preferably to be about 2 or higher. Sub-array 400a and sub-array 400b may include different numbers of columns, and they may also include different numbers of rows.

Because the hybrid memory array of the present invention is benefited by both high density and high access speed, it is suitable for applications that need fast-access and re-programmable memory for executing program codes, and sufficient memory space for storing data. Conventionally, such applications would have no choice but to employ two different types of memory devices, either packaged together or having one embedded within the other. Different types of memory devices can be packaged together by multi-chip package techniques, but the extra conducting wires and leads will seriously slow down the access time. Also, designing two sets of signal controller circuits is extra work. An embedded device would have the benefit of high integration, but to merge processes for different types of memory devices would be expensive and time-consuming.

The hybrid memory array of the present invention includes memory cells of only one kind, therefore the process for manufacturing such hybrid memory array cannot be much more difficult than the process for a conventional memory array. The sub-arrays of the hybrid memory of the present invention are very flexible in size. Even though the preferred ratio of two sub-arrays is about 2 or higher, a user can actually divide the array to any ratio other than 1 to gain some benefits of the present invention. Any change to the ratio of sub-arrays rarely affects the semiconductor estate of the device.

While the foregoing has described in detail one preferred embodiment of the present invention, it will be appreciated that, given the disclosure herein, equivalents and alternatives which do not depart from the invention will be apparent to those people skilled in the art, and those alternatives and equivalents are intended to be encompassed within the scope of the appended claims.

What is claimed is:

1. A hybrid memory array having sub-arrays that are not evenly divided comprising:
    a first sub-array that includes a first number of columns of memory cells;
    a second sub-array that includes a second number of columns of memory cells, wherein said second number of columns of memory cells in the second sub-array is larger than said first number of columns of memory cells in the first sub-array; and
    a row decoder connecting to a first set of word lines, the first set of word lines extending across the first sub-array and for accessing said first sub-array, the row decoder connecting to a second set of word lines, the second set of word lines extending across the second sub-array and for accessing said second sub-array, wherein the length of said first set of word lines extending across the first sub-array is shorter than the length of said second set of word lines extending across the second sub-array.

2. A hybrid memory array as set forth in claim 1, wherein said first number is about one-half of said second number.

3. A hybrid memory array as set forth in claim 1, wherein said first number is less than one-half of said second number.

4. A memory array including:
    a first sub-array that includes a plurality of memory cells arranged in a first number of columns and a second number of rows;
    a second sub-array that includes a plurality of memory cells arranged in a third number of columns and a forth number of rows, wherein said third number of columns in the second sub-array is larger than said first number of columns in the first sub-array and said fourth number of rows in the second sub-array is larger than said second number of rows in the first sub-array;
    a column decoder connecting to a plurality of bit lines, wherein each of said bit lines accesses to each of said first number of columns and said third number of columns respectively; and
    a row decoder connecting to a first set of word lines, the first set of word lines extending across the first sub-array and for accessing said second number of rows of said first sub-array, the row decoder connecting to a second set of word lines, the second set of word lines extending across the second sub-array and for accessing said forth number of rows of said second sub-array, wherein the length of said first set of word lines extending across the first sub-array is shorter than the length of said second set of word lines extending across the second sub-array.

5. A memory array as set forth in claim 4, wherein said first number is about one-half of said third number.

6. A memory array as set forth in claim 4, wherein said first number is less than one-half of said third number.

7. A memory array as set forth in claim 4, wherein said second number is less than said forth number.

8. A method of using a hybrid memory array, wherein said hybrid memory array includes a first sub-array of a first number of columns of memory cells, a second sub-array of a second number of columns of memory cells, a row decoder deposed between and said first and second sub-arrays, and a column decoder, wherein said first number is less than said second number, said method comprising:

using said first sub-array for a first application requiring a access speed to memory cells, the first sub-array having the first number of columns of memory cells; and using said second sub-array for a second application requiring a larger memory cell density; the second sub-array having the second number of columns of memory cells;

wherein the first number of columns of memory cells in the first sub-array is less than the second number of columns of memory cells in the second sub-array.

* * * * *